US012689361B2

(12) United States Patent　(10) Patent No.:　US 12,689,361 B2
Tan et al.　(45) Date of Patent:　Jul. 21, 2026

(54) ULTRA LOW POWER LOW NOISE BUFFER AND ELECTRONIC DEVICE

(71) Applicant: AAC Technologies Pte. Ltd., Singapore (SG)

(72) Inventors: Siewseong Tan, Singapore (SG); Awinash Anand, Nepal (NP); Tiongkee Chua, Singapore (SG)

(73) Assignee: AAC Technologies Pte. Ltd., Singapore (SG)

( * ) Notice: Subject to any disclaimer, the term of this patent is extended or adjusted under 35 U.S.C. 154(b) by 66 days.

(21) Appl. No.: 18/755,629

(22) Filed: Jun. 26, 2024

(65) Prior Publication Data

US 2026/0005679 A1　　Jan. 1, 2026

(51) Int. Cl.
H03K 5/125　　(2006.01)
H03K 5/1252　　(2006.01)
H03F 3/45　　(2006.01)

(52) U.S. Cl.
CPC ....... H03K 5/1252 (2013.01); H03F 3/45475 (2013.01); H03F 2200/372 (2013.01)

(58) Field of Classification Search
CPC .............. H03K 5/1252; H03K 5/1254; H03F 3/45475; H03F 2200/372; H03F 3/45076; H03F 3/45071; H03F 2200/421; H03F 3/45179; H03F 3/45183; H03F 3/45188; H03F 3/45192; H03F 3/4521; H03F 3/45215; H03F 3/45219; H03F 3/45224; H03F 3/45228; H03F 3/45233; H03F 3/45237; H03F 3/45242; H03F 3/45246; H03F 3/45251; H03F 3/45255; H03F 3/4526; H03F 3/45269; G09G 2310/0291
See application file for complete search history.

(56) References Cited

U.S. PATENT DOCUMENTS 7,768,324 B1 * 8/2010 Limotyrakis ...... H03K 19/0019
327/108
2020/0043435 A1 * 2/2020 Kim .................... H03F 3/45219

* cited by examiner

*Primary Examiner* — Jung Kim
(74) *Attorney, Agent, or Firm* — Wiersch Law Group

(57)　　　ABSTRACT

Provided is an ultra low power low noise buffer and an electronic device. The ultra low power low noise buffer includes: a source current drive circuit; and a sink current drive circuit, the sink current driving circuit includes a first transistor, a second transistor and a first current source connected to each other, and the source current drive circuit includes a second current source, a third transistor, an operational amplifier and a voltage source, the second current source is electrically connected to the first transistor and the third transistor, the third transistor is electrically connected to the first transistor and the operational amplifier, and the operational amplifier is electrically connected to the voltage source, the first transistor, the second transistor and the first current source. The chip area, the power consumption, noise induction, output resistance and total harmonic distortion are reduced, and the power supply rejection ratio is improved.

9 Claims, 5 Drawing Sheets

ULTRA LOW POWER LOW NOISE BUFFER AND ELECTRONIC DEVICE

TECHNICAL FIELD

The present disclosure relates to the field of electronic technologies and, in particular, to an ultra low power low noise buffer and an electronic device.

BACKGROUND

Operational amplifier is a circuit unit having a large amplification factor, which is generally used together with a feedback network to constitute a certain functional module. The operational amplifier refers to an amplifier having a designated coupling circuit with feedback. For example, an operational amplifier includes a two-stage amplifier which is complicated with more units included, higher power consumed, greater noise generated and larger area occupied.

A source follower refers to a circuit having a metal oxide semiconductor (MOS) used for impedance conversion and voltage following. Conventional source follower has characteristics such as low noise, small size and without driving capability.

SUMMARY

In view of this, embodiments of the present disclosure provide an ultra low power low noise buffer and an electronic device to improve the power supply rejection ratio (PSRR).

On the one hand, an embodiment of the present disclosure provides an ultra low power low noise buffer, including: a source current drive circuit; and a sink current drive circuit electrically connected to the source current drive circuit. The sink current driving circuit includes a first transistor, a second transistor and a first current source, the first transistor is electrically connected to the first current source, the first transistor is electrically connected to the second transistor, and the second transistor is electrically connected to the first current source. The source current drive circuit includes a second current source, a third transistor, an operational amplifier and a voltage source, the second current source is electrically connected to the first transistor and the third transistor, the third transistor is electrically connected to the first transistor and the operational amplifier, and the operational amplifier is electrically connected to the voltage source, the first transistor, the second transistor and the first current source.

As an improvement, a gate of the first transistor is electrically connected to an input terminal, a source and a body terminal of the first transistor are electrically connected to the second current source, a drain of the third transistor and an output terminal, and a drain of the first transistor is electrically connected to a positive input terminal of the operational amplifier, a first terminal of the first current source and a gate of the second transistor. The gate of the second transistor is electrically connected to the first terminal of the first current source and the positive input terminal of the operational amplifier, a source and a body terminal of the second transistor are electrically connected to a second terminal of the first current source, a negative electrode of the voltage source and ground or a power supply, a drain of the second transistor is electrically connected to the output terminal, a second end of the second current source, a drain of the third transistor and the source and the body terminal of the first transistor.

As an improvement, a source and a body terminal of the third transistor are electrically connected to a first terminal of the second current source and a power supply voltage, a gate of the third transistor is electrically connected to an output terminal of the operational amplifier, and the drain of the third transistor is electrically connected to a second terminal of the second current source and the output terminal. A negative input terminal of the operational amplifier is electrically connected to the second terminal of the first current source and the ground or the power supply through the voltage source.

As an improvement, the operational amplifier comprises a current source and at least one transistor.

As an improvement, the operational amplifier comprises a fourth transistor, a fifth transistor, a sixth transistor, a seventh transistor and a third current source. The third transistor is electrically connected to the seventh transistor, the seventh transistor is electrically connected to the sixth transistor, the sixth transistor is electrically connected to the fifth transistor, the fifth transistor is electrically connected to the fourth transistor, and the third current source is electrically connected to the third transistor, the fourth transistor, the fifth transistor, the sixth transistor, and the seventh transistor.

As an improvement, when the transistors are P-channel metal oxide semiconductor (PMOS) transistors, a gate of the fourth transistor is electrically connected to the first terminal of the first current source, the drain of the first transistor and the gate of the second transistor, a source and a body terminal of the fourth transistor are electrically connected to the ground or the power supply, the second terminal of the first current source, the source and the body terminal of the second transistor, a source and a body terminal of the fifth transistor, a source and a body terminal of the sixth transistor, and a drain of the fourth transistor is electrically connected to a second terminal of the third current source, a gate and a drain of the fifth transistor and a gate of the sixth transistor. A gate and a drain of the fifth transistor are electrically connected to the gate of the sixth transistor and the second terminal of the third current source, and the source and body terminal of the fifth transistor are electrically to the ground or the power supply, the second terminal of the first current source, the source and the body terminal of the second transistor and a source and a body terminal of the sixth transistor.

As an improvement, a drain of the sixth transistor is electrically connected to a drain and a gate of the seventh transistor, and the source and the body terminal of the sixth transistor are electrically to the ground or the power supply, the second terminal of the first current source, the source and the body terminal of the second transistor. The gate of the seventh transistor is electrically connected to the gate of the third transistor, and a source and a body terminal of the seventh transistor are electrically to the power supply voltage, a first terminal of the third current source, the source and the body terminal of the third transistor and the first terminal of the second current source.

As an improvement, when the transistors are N-channel metal oxide semiconductor (NMOS) transistors, a source and a body terminal of the fourth transistor are electrically connected to the first terminal of the first current source, the power supply voltage, the source and the body terminal of the second transistor, a source and a body terminal of the fifth transistor, and a source and a body terminal of the sixth transistor, a gate of the fourth transistor is electrically connected to the second terminal of the first current source, the gate of the second transistor, and the drain of the first transistor, and a drain of the fourth transistor is electrically connected to a first terminal of the third current source, a gate and a drain of the fifth transistor and a gate of the sixth transistor. The source and the body terminal of the fifth transistor are electrically connected to the source and the body terminal of the sixth transistor, the power supply voltage, the first terminal of the first current source, and the source and the body terminal of the second transistor, and the drain and the gate of the fifth transistor are electrically connected to the first terminal of the third current source and the gate of the sixth transistor.

As an improvement, a drain of the sixth transistor is electrically connected to a drain and a gate of the seventh transistor, and the source and the body terminal of the sixth transistor are electrically to the power supply voltage, the first terminal of the first current source, the source and the body terminal of the second transistor. The gate and the drain of the seventh transistor are electrically connected to the gate of the third transistor, a source and a body terminal of the seventh transistor are electrically to the ground or the power supply, a second terminal of the third current source, the source and the body terminal of the third transistor and the second terminal of the second current source.

On the other hand, an embodiment of the present disclosure provides an electronic device, including the above-mentioned ultra low power low noise buffer.

In the technical solutions according to embodiments of the present disclosure, the ultra low power low noise buffer includes: a source current drive circuit and a sink current drive circuit. The sink current drive circuit is electrically connected to the source current drive circuit. The sink current drive circuit includes a first transistor, a second transistor and a first current source. The first transistor is electrically connected to the first current source, the first transistor is electrically connected to the second transistor, and the second transistor is electrically connected to the first current source. The source current drive circuit includes a second current source, a third transistor, an operational amplifier and a voltage source. The second current source is electrically connected to the first transistor and the third transistor, the third transistor is electrically connected to the first transistor and the operational amplifier, and the operational amplifier is electrically connected to the voltage source, the first transistor, the second transistor and the first current source. The technical solution according to embodiments of the present disclosure, through incorporating a source current drive circuit to improve the source current drive capability and incorporating a sink current drive circuit to improve the sink current drive capability, which reduces chip area, power consumption, noise induction, output resistance and total harmonic distortion (Total Harmonic Distortion, THD), and thereby improving the PSRR.

BRIEF DESCRIPTION OF DRAWINGS

In order to better illustrate the technical solutions of the embodiments of the present disclosure, the accompanying drawings used in the embodiments will be introduced below. It is appreciated that, the accompanying drawings in the following description are only some embodiments of the present disclosure. Person skilled in the art can also obtain other drawings based on these drawings without paying creative effort.

DESCRIPTION OF EMBODIMENTS

In order to better understand the technical solutions of the present disclosure, the embodiments of the present disclosure will be described in detail below in conjunction with the accompanying drawings.

It should be clear that the described embodiments are only some of the embodiments of the present disclosure, rather than all of them. Based on the embodiments of the present disclosure, all other embodiments obtained by persons skilled in the art without creative efforts fall within the protection scope of the present disclosure.

Terms used in the embodiments of the present disclosure are only for the purpose of describing specific embodiments, and are not intended to limit the present disclosure. As used in the embodiments of the present disclosure and the appended claims, the singular forms "a/an", "said" and "the" are also intended to include the plural forms, unless the context clearly indicates otherwise.

It should be understood that the term "and/or" used herein is only an association relationship describing associated objects, which means that there may be three relationships, for example, A and/or B, which may mean that A exists alone, B exists alone, and A and B exist simultaneously. In addition, the character "/" in this article generally indicates that the contextual objects are an "or" relationship.

Figure 1:
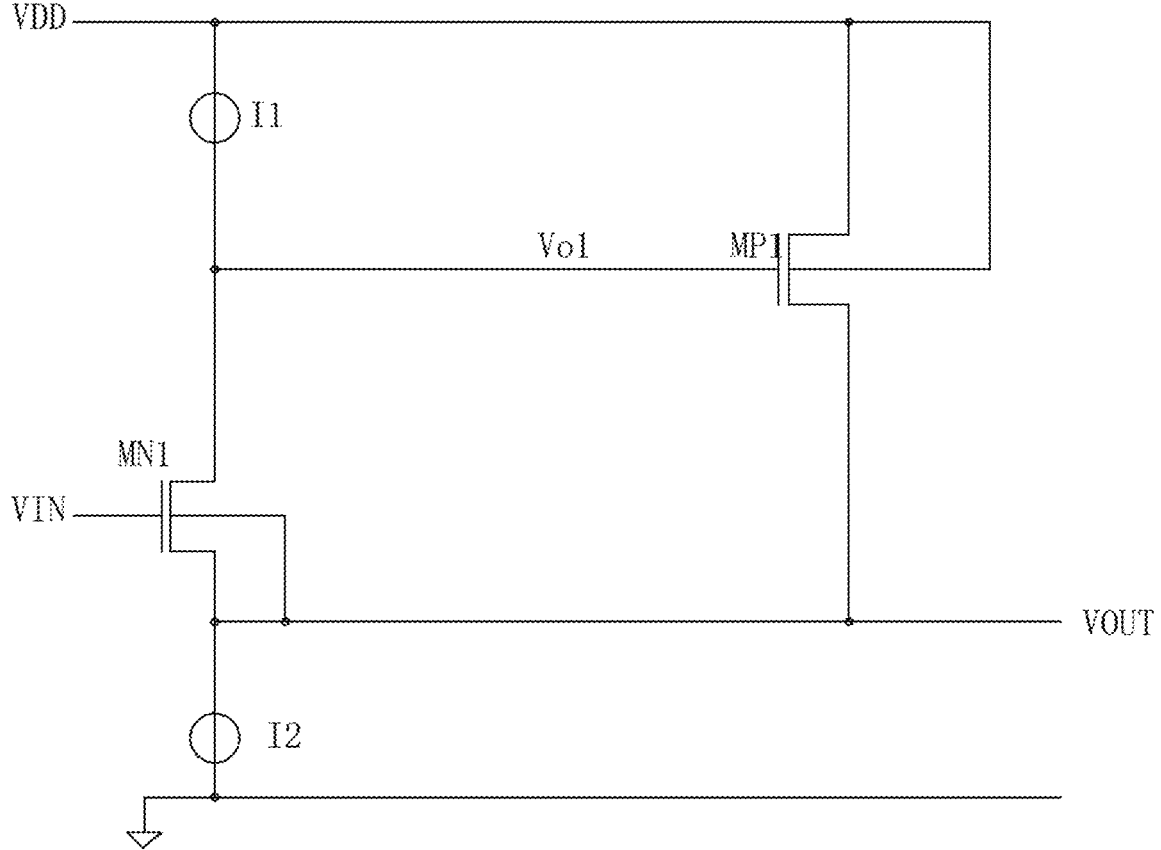
FIG. 1 is a circuit diagram of an ultra low power low noise buffer provided in the related art.

An ultra low power low noise buffer is provided in the related art, and FIG. 1 is a circuit diagram of the ultra low power low noise buffer provided in the related art. As shown in FIG. 1, the ultra low power low noise buffer includes a first metal oxide semiconductor (MOS) MN1, a second metal oxide semiconductor (MOS) MP1, a first source current I1, a second source current I2, an input terminal VIN for providing an input signal, and an output terminal VOUT for outputting an electrical signal. The input terminal VIN is electrically connected to the gate of the first MOS MN1 to output an electrical signal to the first MOS MN1. The drain of the first MOS MN1 is electrically connected to the power supply voltage VDD through the first source current I1, and the source and body terminal of the first MOS MN1 are both electrically connected to the output terminal VOUT to output electrical signals. The source of the first MOS MN1 is grounded through the second source current I2, and the first source current I1 and the second source current I2 provide working current for the first MOS MN1 and the second MOS MP1. The source and body terminals of the second MOS MP1 are both electrically connected to the power supply voltage VDD, the gate of the second MOS MP1 is electrically connected to the drain of the first MOS MN1, and the drain of the second MOS MP1 is electrically connected to the output terminal VOUT. The first MOS MN1 is an N-type MOS, and the second MOS MP1 is a P-type MOS.

The power supply noise (Vnoise, VDD) is coupled to the gate voltage Vo1 (Vnoise, Vo1 Vnoise, VDD) of the second MOS MP1 through the gate-source coupling effect of the second MOS MP1. The power supply noise is coupled to the output terminal VOUT through the first MOS MN1.

VDD$\approx$R1/(R1+R2), where R1 is the effective impedance of the output terminal VOUT (excluding the first MOS MN1), and R2 is the equivalent impedance of the signal path from the drain of the first MOS MN1. In the related art, R2=r02, where r02 is the impedance of the first MOS MN1. Therefore, the PSRR of the ultra low power low noise buffer in the related art is low.

Figure 2:
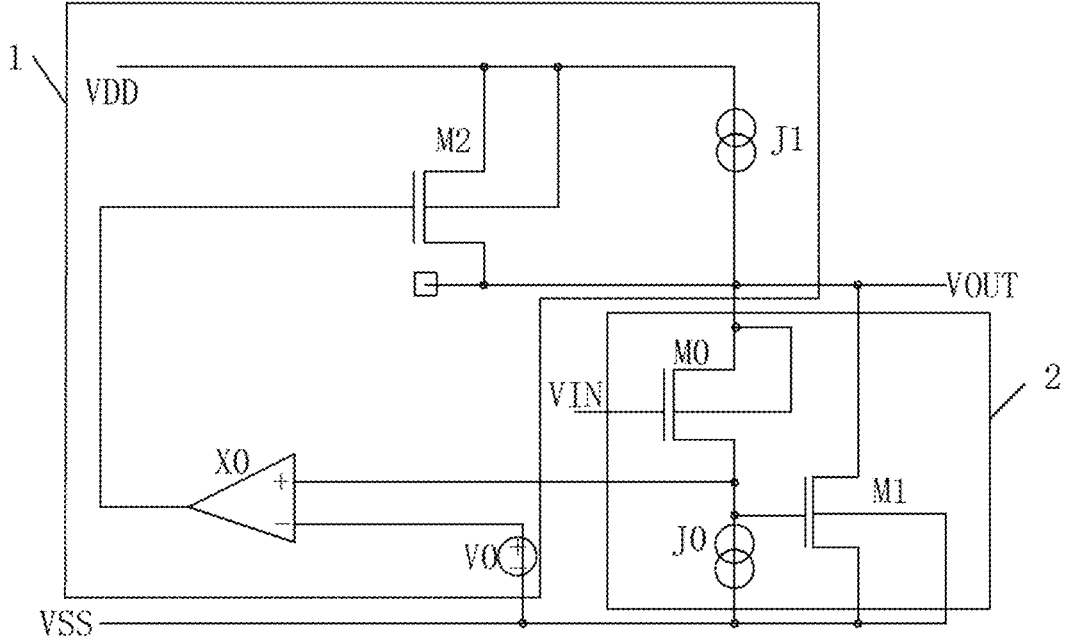
FIG. 2 is a circuit diagram of an ultra low power low noise buffer according to an embodiment of the present disclosure.

In order to solve the technical problems in the related art, an embodiment of the present disclosure provides an ultra low power low noise buffer as shown in FIG. 2. In FIG. 2, the ultra low power low noise buffer includes: a source current drive circuit 1 and a sink current drive circuit 2. The sink current drive circuit 2 is electrically connected to the source current drive circuit 1.

The sink current drive circuit 2 includes a first transistor M0, a second transistor M1 and a first current source J0. The first transistor M0 is electrically connected to the first current source J0, the first transistor M0 is electrically connected to the second transistor M1, and the second transistor M1 is electrically connected to the first current source J0.

The source current driving circuit 1 includes a second current source J1, a third transistor M2, an operational amplifier X0 and a voltage source V0. The second current source J1 is electrically connected to the first transistor M0 and the third transistor M2, and the third transistor M2 is electrically connected to the first transistor M0 and the operational amplifier X0, and the operational amplifier X0 is electrically connected to the voltage source V0, the first transistor M0, the second transistor M1 and the first current source J0.

In an embodiment, the gate of the first transistor M0 is electrically connected to the input terminal VIN, and the source and body terminals of the first transistor M0 are electrically connected to the second current source J1, the drain of the third transistor M2, and the output terminal VOUT. The drain of the first transistor M0 is electrically connected to the positive input terminal of the operational amplifier X0, the first terminal of the first current source J0, and the gate of the second transistor M1.

The gate of the second transistor M1 is electrically connected to the first terminal of the first current source J0 and the positive input terminal of the operational amplifier X0. The source and body terminals of the second transistor M1 are both electrically connected to the second terminal of the first current source J0, the negative electrode of the voltage source V0, and the ground or the power supply VSS. The drain of the second transistor M1 is electrically connected to the output terminal VOUT, the second terminal of the second current source J1, the drain of the third transistor M2, and the source and body terminals of the first transistor M0.

In an embodiment, both the source and body terminals of the third transistor M2 are electrically connected to the first terminal of the second current source J1 and the power supply voltage VDD. The gate of the third transistor M2 is electrically connected to the output terminal of the operational amplifier X0. The drain of the third transistor M2 is electrically connected to the second terminal of the second current source J1 and the output terminal VOUT.

The negative input terminal of the operational amplifier X0 is electrically connected to the second terminal of the first current source J0 and the ground or the power supply VSS through the voltage source V0.

In an embodiment, the operational amplifier X0 includes a current source and at least one transistor.

In an embodiment, the operational amplifier includes a fourth transistor M3, a fifth transistor M4, a sixth transistor M5, a seventh transistor M6 and a third current source J2.

The third transistor M2 is electrically connected to the seventh transistor M6, the seventh transistor M6 is electrically connected to the sixth transistor M5, the sixth transistor M5 is electrically connected to the fifth transistor M4, the fifth transistor M4 is electrically connected to the fourth transistor M3. The current source J2 is electrically connected to the third transistor M2, the fourth transistor M3, the fifth transistor M4, the sixth transistor M5 and the seventh transistor M6.

Figure 3:
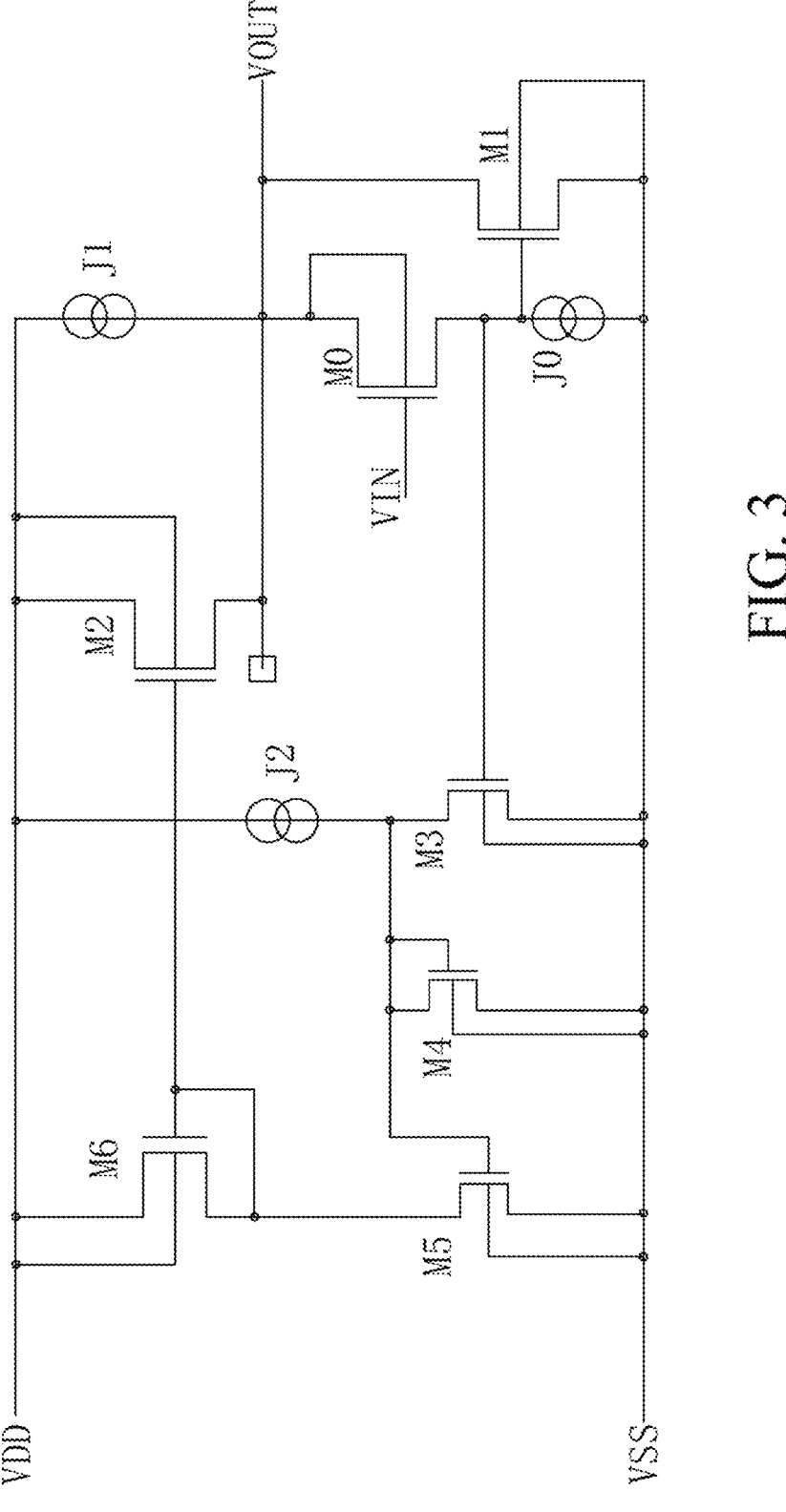
FIG. 3 is a circuit diagram of another ultra low power low noise buffer according to an embodiment of the present disclosure.

As shown in FIG. 3, which is a circuit diagram of another ultra low power low noise buffer according to an embodiment of the present disclosure. In FIG. 3, when the transistor is a P-channel metal oxide semiconductor (PMOS) transistor, the gate of the fourth transistor M3 is electrically connected to the first terminal of the first current source J0, the drain of the first transistor M0 and the gate of the second transistor M1. The source and body terminals of the fourth transistor M3 are both electrically connected to the ground or the power supply VSS, the second terminal of the first current source J0, the source and body terminals of the second transistor M1, the source and body terminals of the fifth transistor M4, and the source and body terminals of the sixth transistor M5. The drain of the fourth transistor M3 is electrically connected to the second terminal of the third current source J2, the gate and the drain of the fifth transistor M4, and the gate of the sixth transistor M5.

Both the gate and the drain of the fifth transistor M4 are electrically connected to the gate of the sixth transistor M5 and the second terminal of the third current source J2. The source and body terminals of the fifth transistor M4 are both electrically to the ground or the power supply VSS, the second terminal of the first current source J0, the source and body terminals of the second transistor M1, and the source and body terminals of the sixth transistor M5.

The drain of the sixth transistor M5 is electrically connected to the drain and gate of the seventh transistor M6. The source and body terminals of the sixth transistor M5 are both electrically to the ground or the power supply VSS, the second terminal of the first current source J0, the source and body terminals of the second transistor M1.

The gate of the seventh transistor M6 is electrically connected to the gate of the third transistor M2. The source and body terminals of the seventh transistor M6 are electrically connected to the power supply voltage VDD, the first terminal of the third current source J2, the source and body terminals of the third transistor M2, and the first terminal of the second current source J1.

Figure 4:
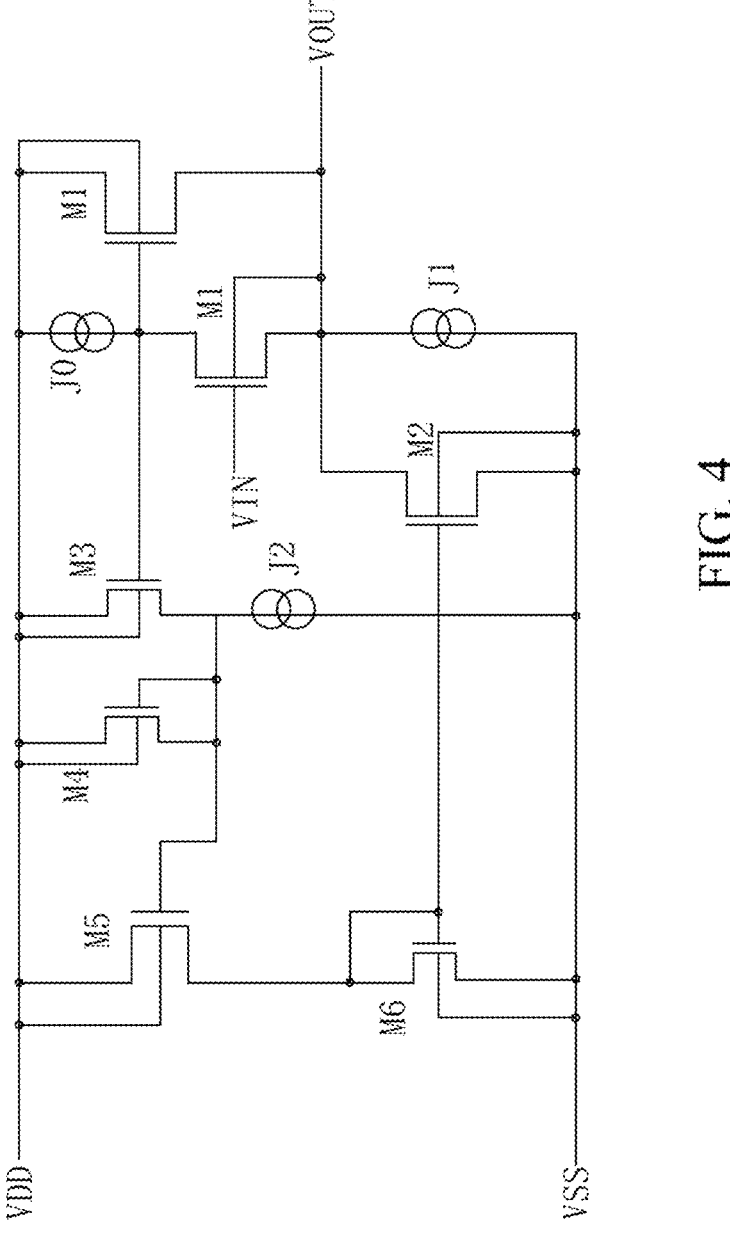
FIG. 4 is a circuit diagram of still another ultra low power low noise buffer according to an embodiment of the present disclosure.

As shown in FIG. 4, which is a circuit diagram of another ultra low power low noise buffer according an embodiment of the present disclosure. In FIG. 4, when the transistor is an N-channel metal oxide semiconductor (NMOS) transistor, the source and body terminals of the fourth transistor M3 are electrically connected to the first terminal of the first current source J0, the power supply voltage VDD, the source and body terminals of the second transistor M1, the source and body terminals of the fifth transistor M4, and the source and body terminals of the sixth transistor M5. The gate of the fourth transistor M3 is electrically connected to the second terminal of the first current source J0, the gate of the second transistor M1, and the drain of the first transistor M0. The drain of the fourth transistor M3 is electrically connected to the first terminal of the third current source J2, the gate and drain of the fifth transistor M4, and the gate of the sixth transistor M5.

Both the source and body terminals of the fifth transistor M4 are electrically connected to the source and body terminals of the sixth transistor M5, the power supply voltage VDD, the first terminal of the first current source J0, and the source and body terminals of the second transistor M1. Both the drain and gate of the fifth transistor M4 are electrically connected to the first terminal of the third current source J2 and the gate of the sixth transistor M5.

The drain of the sixth transistor M5 is electrically connected to the drain and gate of the seventh transistor M6. The source and body terminals of the sixth transistor M5 are electrically connected to the power supply voltage VDD, the first terminal of the first current source J0, the source and body terminals of the second transistor M1.

Both the gate and the drain of the seventh transistor M6 are electrically connected to the gate of the third transistor M2. The source and the body terminals of the seventh transistor M6 are electrically connected to the ground or the power supply VSS, the second terminal of the third current source J2, the source and body terminals of the third transistor M2 and the second terminal of the second current source J1.

In the technical solutions according to embodiments of the present disclosure, the ultra low power low noise buffer includes: a source current drive circuit and a sink current drive circuit. The sink current drive circuit is electrically connected to the source current drive circuit. The sink current drive circuit includes a first transistor, a second transistor and a first current source. The first transistor is electrically connected to the first current source, the first transistor is electrically connected to the second transistor, and the second transistor is electrically connected to the first current source. The source current drive circuit includes a second current source, a third transistor, an operational amplifier and a voltage source. The second current source is electrically connected to the first transistor and the third transistor, the third transistor is electrically connected to the first transistor and the operational amplifier, and the operational amplifier is electrically connected to the voltage source, the first transistor, the second transistor and the first current source. The technical solution according to embodiments of the present disclosure reduces chip area, power consumption, noise induction, output resistance and total harmonic distortion (Total Harmonic Distortion, THD), and thereby improving the PSRR.

Compare to the ultra low power low noise buffer of the related art shown in FIG. 1, in the embodiments of the present disclosure, through providing the source current drive circuit 1 and the sink current drive circuit 2, the sink/source driving capability is significantly improved, thereby reducing the output resistance. In addition, it is possible to provide both sink/source negative feedback to stable the output voltage to supply noise, thereby improving the PSRR. Specifically, the sink/source drive circuit cooperatively work to enhance the circuit drive capability across different output loading, keep the transistor M0 propagate input signal to output with minimum lost and distortion, thereby achieving low THD.

Figure 5:
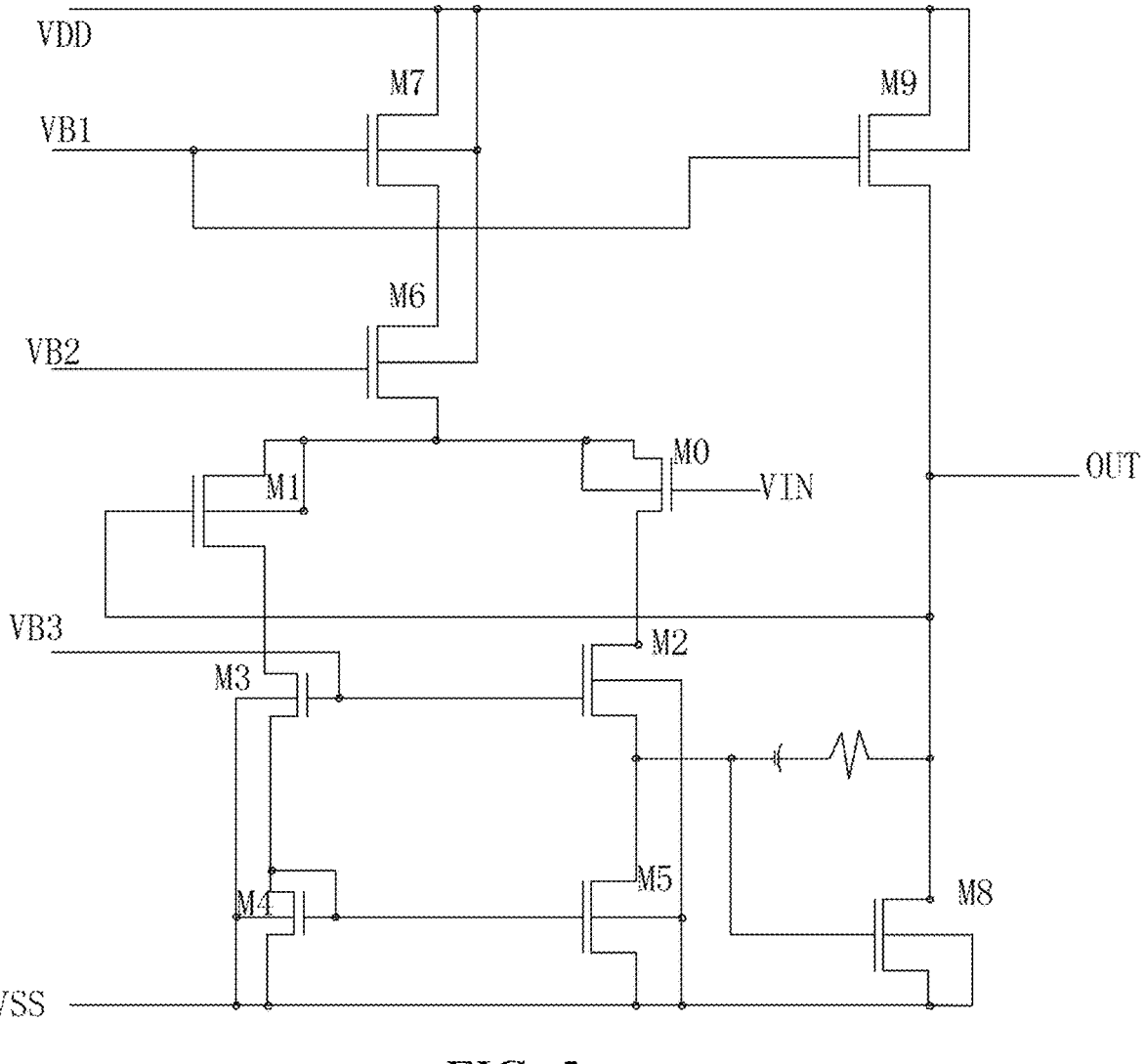
FIG. 5 is a circuit diagram of a conventional low-noise amplifier in the related art.

As a further comparison, FIG. 5 is a circuit diagram of a conventional low-noise amplifier in the related art. Compared to the low-noise amplifier in FIG. 5, the present disclosure just needs one device (M0) for signal path, fewer feedback devices for the sink/source drive circuit are required. Therefore, the area occupied is much smaller compared to the conventional low-noise amplifier. Due to the single transistor (M0) dominants the noise, compare to conventional low noise amplifier, input pair transistors (M0, M1) and load transistors (M4, M5) will contribute to the noise, and thus the solutions in the present disclosure provide advantages of lower noise and less power consumption.

An embodiment of the present disclosure provides an electronic device, including the above-mentioned ultra low power low noise buffer. For example, electronic devices may include but not limited to microphones, smartphones, cameras, headphones, and the like.

The above descriptions are only preferred embodiments of the present disclosure, and are not intended to limit the present disclosure. Any modifications, equivalent replacements, improvements, etc. made within the spirit and principles of the present disclosure shall be included within the protection scope of the present disclosure.

What is claimed is:

1. An ultra low power low noise buffer, comprising:
a source current drive circuit; and
a sink current drive circuit electrically connected to the source current drive circuit,
wherein the sink current driving circuit includes a first transistor, a second transistor and a first current source, the first transistor is electrically connected to the first current source, the first transistor is electrically connected to the second transistor, and the second transistor is electrically connected to the first current source, and
wherein the source current drive circuit includes a second current source, a third transistor, an operational amplifier and a voltage source, the second current source is electrically connected to the first transistor and the third transistor, the third transistor is electrically connected to the first transistor and the operational amplifier, and the operational amplifier is electrically connected to the voltage source, the first transistor, the second transistor and the first current source;
wherein a gate of the first transistor is electrically connected to an input terminal, a source and a body terminal of the first transistor are electrically connected to the second current source, a drain of the third transistor and an output terminal, and a drain of the first transistor is electrically connected to a positive input terminal of the operational amplifier, a first terminal of the first current source and a gate of the second transistor;
the gate of the second transistor is electrically connected to the first terminal of the first current source and the positive input terminal of the operational amplifier, a source and a body terminal of the second transistor are electrically connected to a second terminal of the first current source, a negative electrode of the voltage source and ground or a power supply, a drain of the second transistor is electrically connected to the output terminal, a second end of the second current source, a drain of the third transistor and the source and the body terminal of the first transistor.

2. The ultra low power low noise buffer according to claim 1, wherein a source and a body terminal of the third transistor are electrically connected to a first terminal of the second current source and a power supply voltage, a gate of the third transistor is electrically connected to an output terminal of the operational amplifier, and the drain of the third transistor is electrically connected to a second terminal of the second current source and the output terminal, and
a negative input terminal of the operational amplifier is electrically connected to the second terminal of the first current source and the ground or the power supply through the voltage source.

3. The ultra low power low noise buffer of claim 2, wherein the operational amplifier comprises a current source and at least one transistor.

4. The ultra low power low noise buffer according to claim 3, wherein the operational amplifier comprises a fourth transistor, a fifth transistor, a sixth transistor, a seventh transistor and a third current source, wherein the third transistor is electrically connected to the seventh transistor, the seventh transistor is electrically connected to the sixth transistor, the sixth transistor is electrically connected to the fifth transistor, the fifth transistor is electrically connected to the fourth transistor, and the third current source is electrically connected to the third transistor, the fourth transistor, the fifth transistor, the sixth transistor, and the seventh transistor.

5. The ultra low power low noise buffer according to claim 4, wherein when the transistors are P-channel metal oxide semiconductor (PMOS) transistors, a gate of the fourth transistor is electrically connected to the first terminal of the first current source, the drain of the first transistor and the gate of the second transistor, a source and a body terminal of the fourth transistor are electrically connected to the ground or the power supply, the second terminal of the first current source, the source and the body terminal of the second transistor, a source and a body terminal of the fifth transistor, a source and a body terminal of the sixth transistor, and a drain of the fourth transistor is electrically connected to a second terminal of the third current source, a gate and a drain of the fifth transistor and a gate of the sixth transistor, and wherein a gate and a drain of the fifth transistor are electrically connected to the gate of the sixth transistor and the second terminal of the third current source, and the source and body terminal of the fifth transistor are electrically to the ground or the power supply, the second terminal of the first current source, the source and the body terminal of the second transistor and a source and a body terminal of the sixth transistor.

6. The ultra low power low noise buffer according to claim 5, wherein a drain of the sixth transistor is electrically connected to a drain and a gate of the seventh transistor, and the source and the body terminal of the sixth transistor are electrically to the ground or the power supply, the second terminal of the first current source, the source and the body terminal of the second transistor, and the gate of the seventh transistor is electrically connected to the gate of the third transistor, and a source and a body terminal of the seventh transistor are electrically to the power supply voltage, a first terminal of the third current source, the source and the body terminal of the third transistor and the first terminal of the second current source.

7. The ultra low power low noise buffer according to claim 4, wherein when the transistors are N-channel metal oxide semiconductor (NMOS) transistors, a source and a body terminal of the fourth transistor are electrically connected to the first terminal of the first current source, the power supply voltage, the source and the body terminal of the second transistor, a source and a body terminal of the fifth transistor, and a source and a body terminal of the sixth transistor, a gate of the fourth transistor is electrically connected to the second terminal of the first current source, the gate of the second transistor, and the drain of the first transistor, and a drain of the fourth transistor is electrically connected to a first terminal of the third current source, a gate and a drain of the fifth transistor and a gate of the sixth transistor, and wherein the source and the body terminal of the fifth transistor are electrically connected to the source and the body terminal of the sixth transistor, the power supply voltage, the first terminal of the first current source, and the source and the body terminal of the second transistor, and the drain and the gate of the fifth transistor are electrically connected to the first terminal of the third current source and the gate of the sixth transistor.

8. The ultra low power low noise buffer according to claim 7, wherein a drain of the sixth transistor is electrically connected to a drain and a gate of the seventh transistor, and the source and the body terminal of the sixth transistor are electrically to the power supply voltage, the first terminal of the first current source, the source and the body terminal of the second transistor, and the gate and the drain of the seventh transistor are electrically connected to the gate of the third transistor, a source and a body terminal of the seventh transistor are electrically to the ground or the power supply, a second terminal of the third current source, the source and the body terminal of the third transistor and the second terminal of the second current source.

9. An electronic device, comprising an ultra low power low noise buffer, wherein the ultra low power low noise buffer comprises:

a source current drive circuit; and a sink current drive circuit electrically connected to the source current drive circuit, wherein the sink current driving circuit includes a first transistor, a second transistor and a first current source, the first transistor is electrically connected to the first current source, the first transistor is electrically connected to the second transistor, and the second transistor is electrically connected to the first current source, and wherein the source current drive circuit includes a second current source, a third transistor, an operational amplifier and a voltage source, the second current source is electrically connected to the first transistor and the third transistor, the third transistor is electrically connected to the first transistor and the operational amplifier, and the operational amplifier is electrically connected to the voltage source, the first transistor, the second transistor and the first current source;

wherein a gate of the first transistor is electrically connected to an input terminal, a source and a body terminal of the first transistor are electrically connected to the second current source, a drain of the third transistor and an output terminal, and a drain of the first transistor is electrically connected to a positive input terminal of the operational amplifier, a first terminal of the first current source and a gate of the second transistor;

the gate of the second transistor is electrically connected to the first terminal of the first current source and the positive input terminal of the operational amplifier, a source and a body terminal of the second transistor are electrically connected to a second terminal of the first current source, a negative electrode of the voltage source and ground or a power supply, a drain of the second transistor is electrically connected to the output terminal, a second end of the second current source, a drain of the third transistor and the source and the body terminal of the first transistor.

\* \* \* \* \*